(12) United States Patent
Kennedy et al.

(10) Patent No.: US 8,198,576 B2
(45) Date of Patent: Jun. 12, 2012

(54) THREE-DIMENSIONAL LADAR MODULE WITH ALIGNMENT REFERENCE INSERT CIRCUITRY COMPRISING HIGH DENSITY INTERCONNECT STRUCTURE

(75) Inventors: John Kennedy, Irvine, CA (US); David Ludwig, Irvine, CA (US); Christian Krutzik, Costa Mesa, CA (US)

(73) Assignee: Aprolase Development Co., LLC, Wilmington, DE (US)

( * ) Notice: Subject to any disclaimer, the term of this patent is extended or adjusted under 35 U.S.C. 154(b) by 666 days.

(21) Appl. No.: 12/287,691

(22) Filed: Oct. 10, 2008

(65) Prior Publication Data

US 2009/0079956 A1   Mar. 26, 2009

Related U.S. Application Data

(63) Continuation-in-part of application No. 11/499,403, filed on Aug. 4, 2006, now abandoned, and a continuation-in-part of application No. 11/706,724, filed on Feb. 15, 2007, now Pat. No. 7,436,494, which is a continuation-in-part of application No. 10/806,037, filed on Mar. 22, 2004, now Pat. No. 7,180,579.

(60) Provisional application No. 60/711,375, filed on Aug. 26, 2005, provisional application No. 60/785,135, filed on Mar. 24, 2006, provisional application No. 60/462,677, filed on Mar. 28, 2003.

(51) Int. Cl.
*G01C 3/08* (2006.01)

(52) U.S. Cl. ...................................... 250/210; 356/4.01

(58) Field of Classification Search .................. 250/210, 250/214 DC, 214.1, 214 R; 356/139.03, 356/4.01–4.1, 3.01–3.15, 5.01–5.15, 6–22
See application file for complete search history.

(56) References Cited

U.S. PATENT DOCUMENTS

| | | | |
|---|---|---|---|
| 644,968 | A | 3/1900 | Burt |
| 3,897,150 | A | 7/1975 | Bridges et al. |
| 4,574,331 | A | 3/1986 | Smolley |
| 4,659,931 | A | 4/1987 | Schmitz et al. |
| 5,198,657 | A | 3/1993 | Trost et al. |
| 5,214,274 | A | 5/1993 | Yang |
| 5,262,837 | A | 11/1993 | Shyy |
| 5,274,430 | A | 12/1993 | Lux |
| 5,426,566 | A | 6/1995 | Beilstein et al. |

(Continued)

FOREIGN PATENT DOCUMENTS

JP           11-355813           12/1999

OTHER PUBLICATIONS

Non-final Office Action issued in U.S. Appl. No. 12/607,253 and mailed Jul. 19, 2010.

(Continued)

*Primary Examiner* — Seung C Sohn

(57) ABSTRACT

A 3-D LADAR imaging system incorporating stacked microelectronic layers is provided. A reference insert circuit inserts data into the FIFO registers at a preselected location to provide a reference point at which all FIFO shift register data may be aligned to accommodate for timing differences between layers and channels. The bin data representing the photon reflections from the various target surfaces are read out of the FIFO and processed using appropriate circuitry such as a field programmable gate array to create a synchronized 3-D point cloud for creating a 3-D target image.

33 Claims, 8 Drawing Sheets

U.S. PATENT DOCUMENTS

| | | | |
|---|---|---|---|
| 5,608,514 | A | 3/1997 | Stann et al. |
| 5,682,229 | A | 10/1997 | Wangler |
| 5,875,158 | A | 2/1999 | Schell |
| 5,925,924 | A | 7/1999 | Cronin et al. |
| 5,953,110 | A | 9/1999 | Burns |
| 5,953,588 | A | 9/1999 | Camien et al. |
| 6,031,601 | A * | 2/2000 | McCusker et al. ........... 356/5.01 |
| 6,042,388 | A | 3/2000 | Tustaniwskyj et al. |
| 6,133,989 | A | 10/2000 | Stettner et al. |
| 6,246,468 | B1 * | 6/2001 | Dimsdale .................... 356/4.02 |
| 6,264,476 | B1 | 7/2001 | Li et al. |
| 6,384,519 | B1 | 5/2002 | Beetz et al. |
| 6,414,746 | B1 | 7/2002 | Stettner et al. |
| 6,522,396 | B1 | 2/2003 | Halmos |
| 6,650,404 | B1 | 11/2003 | Crawford |
| 6,791,171 | B2 | 9/2004 | Mok et al. |
| 6,849,388 | B2 | 2/2005 | Clark |
| 7,098,999 | B1 | 8/2006 | Halmos et al. |
| 7,199,872 | B2 | 4/2007 | Van Cranenbroeck |
| 7,265,993 | B1 | 9/2007 | Slone et al. |
| 7,647,199 | B2 * | 1/2010 | Green et al. .................. 702/150 |
| 7,895,015 | B2 * | 2/2011 | Parker et al. .................. 702/158 |
| 7,941,759 | B2 * | 5/2011 | Kreissl et al. ................. 715/772 |
| 2003/0221313 | A1 | 12/2003 | Gann |

OTHER PUBLICATIONS

Non-Final Office Action mailed on Apr. 15, 2009 in corresponding U.S. Appl. No. 11/499,403.

Non-final Office Action issued in U.S. Appl. No. 12/607,253 and mailed Sep. 15, 2011.

Non-final Office Action issued in U.S. Appl. No. 12/607,253 and mailed May 2, 2011.

* cited by examiner

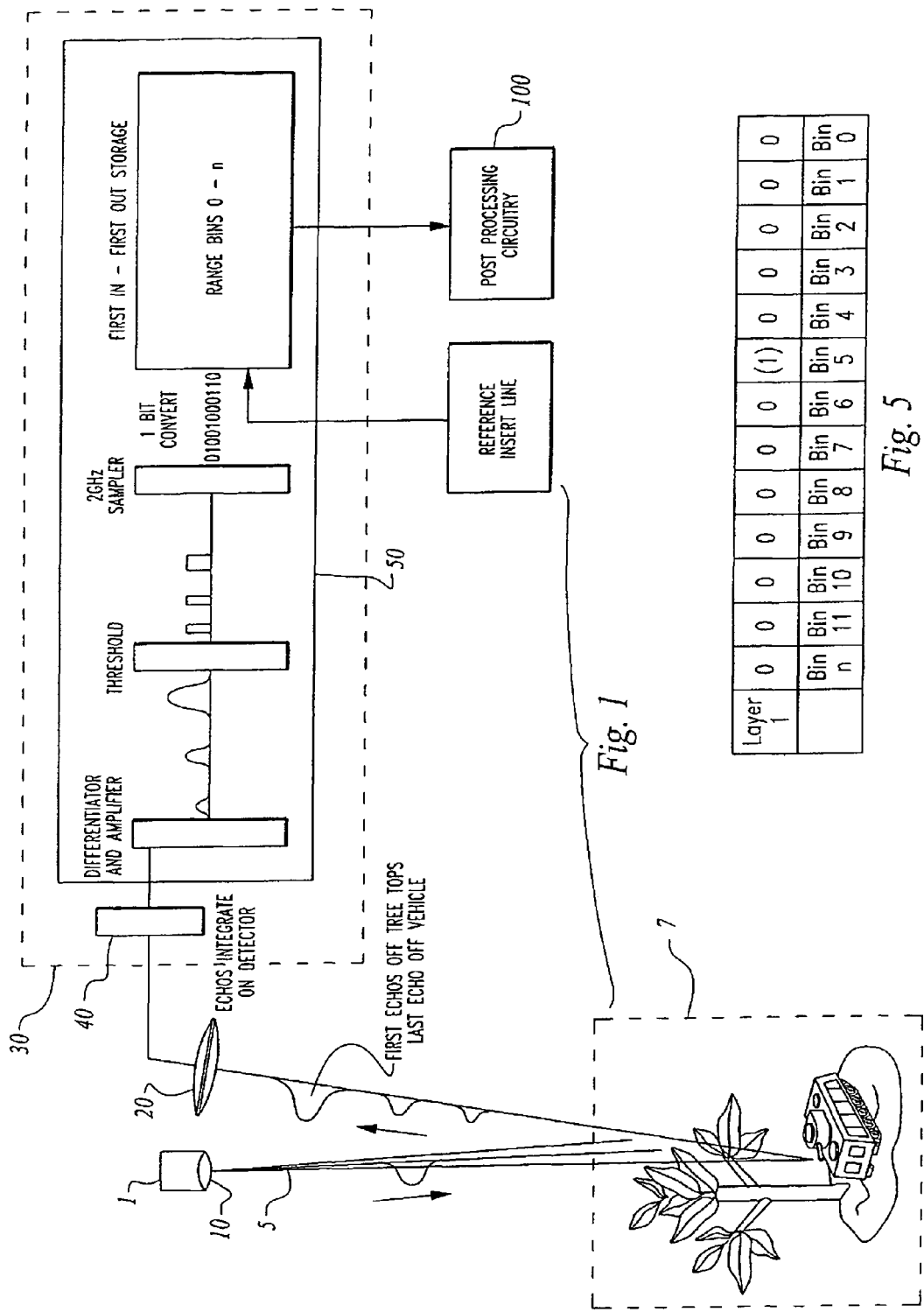

** Reference Insert
(0)=Laser Silence
(1)=Laser Echo Return
X=Unfilled Bin
| Clock Cycle No. | Bin n | Bin 11 | Bin 10 | Bin 9 | Bin 8 | Bin 7 | Bin 6 | Bin 5 | Bin 4 | Bin 3 | Bin 2 | Bin 1 | Bin 0 |
|---|---|---|---|---|---|---|---|---|---|---|---|---|---|
| 0 | 0 | X | X | X | X | X | X | X | X | X | X | X | X |
| 1 | (1) | 0 | X | X | X | X | X | X | X | X | X | X | X |
| 2 | 0 | (1) | 0 | X | X | X | X | X | X | X | X | X | X |
| 3 | 0 | 0 | (1) | 0 | X | X | X | X | X | X | X | X | X |
| 4 | 0 | 0 | 0 | (1) | 0 | X | X | X | X | X | X | X | X |
| 5 | 0 | 0 | 0 | 0 | (1) | 0 | X | X | X | X | X | X | X |
| 6 | 0 | 0 | 0 | 0 | 0 | (1) | 0 | X | X | X | X | X | X |
| 7 | 0 | 0 | 0 | 0 | 0 | 0 | (1) | 0 | X | X | X | X | X |
| 8 | 0 | 0 | 0 | 0 | 0 | 0 | 0 | (1) | 0 | X | X | X | X |
| 9 | 0 | 0 | 0 | 0 | 0 | 0 | 0 | 0 | (1) | 0** | X | X | X |
| 10 | 1** | 0 | 0 | 0 | 0 | 0 | 0 | 0 | 0 | (1) | 0 | X | X |
| 11 | 1** | 1** | 0 | 0 | 0 | 0 | 0 | 0 | 0 | 0 | (1) | 0 | X |
| 12 | 1** | 1** | 1** | 0 | 0 | 0 | 0 | 0 | 0 | 0 | 0 | (1) | 0 |
*Fig. 7*
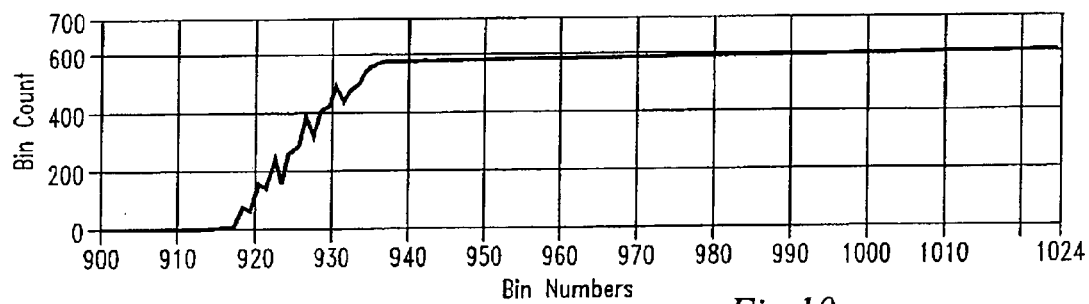
*Fig 10a*
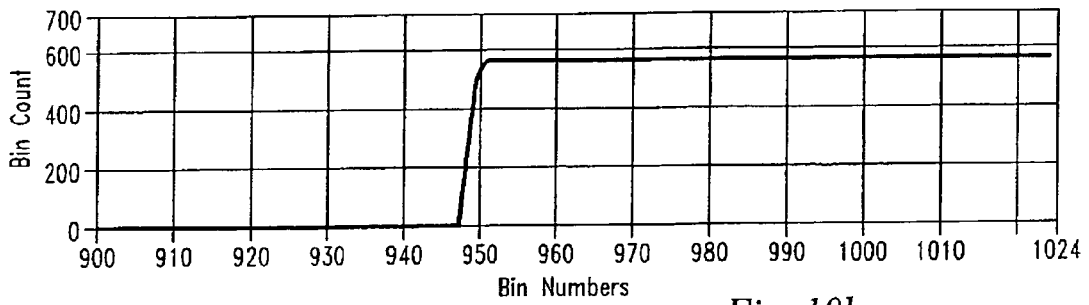
*Fig. 10b*

| Layer | Bin 140 | Bin 141 | Bin 142 | Bin 143 | Bin 144 | Bin 145 | Bin 146 | Bin 147 | Bin 148 | Bin 149 | Bin 150 | Bin 151 | Bin 152 | Bin 153 | Bin 154 | Bin 155 | Bin 156 | Bin 157 | Bin 158 |
|---|---|---|---|---|---|---|---|---|---|---|---|---|---|---|---|---|---|---|---|
| 1 | 0 | 0 | 0 | 0 | 0 | 1 | 1 | 0 | 0 | 0 | 0 | 0 | 0 | 0 | 0 | 0 | 0 | 0 | 0 |
| 2 | 0 | 0 | 1 | 1 | 0 | 0 | 0 | 0 | 0 | 0 | 0 | 0 | 0 | 0 | 0 | 0 | 0 | 0 | 0 |
| 3 | 0 | 0 | 0 | 0 | 0 | 0 | 1 | 1 | 0 | 0 | 0 | 0 | 0 | 0 | 0 | 0 | 0 | 0 | 0 |
| 4 | 0 | 0 | 0 | 0 | 0 | 0 | 0 | 0 | 0 | 1 | 1 | 0 | 0 | 0 | 0 | 0 | 0 | 0 | 0 |

*Fig. 9a*

| Layer | Bin 940 | Bin 941 | Bin 942 | Bin 943 | Bin 944 | Bin 945 | Bin 946 | Bin 947 | Bin 948 | Bin 949 | Bin 950 | Bin 951 | Bin 992 | Bin 953 | Bin 954 | Bin 955 | Bin 956 | Bin 957 | Bin 958 |
|---|---|---|---|---|---|---|---|---|---|---|---|---|---|---|---|---|---|---|---|
| 1 | 0 | 0 | 0 | 0 | 0 | 1 | 1 | 1 | 1 | 1 | 1 | 1 | 1 | 1 | 1 | 1 | 1 | 1 | 1 |
| 2 | 0 | 0 | 1 | 1 | 1 | 1 | 1 | 1 | 1 | 1 | 1 | 1 | 1 | 1 | 1 | 1 | 1 | 1 | 1 |
| 3 | 0 | 0 | 0 | 0 | 0 | 0 | 1 | 1 | 1 | 1 | 1 | 1 | 1 | 1 | 1 | 1 | 1 | 1 | 1 |
| 4 | 0 | 0 | 0 | 0 | 0 | 0 | 0 | 0 | 0 | 1 | 1 | 1 | 1 | 1 | 1 | 1 | 1 | 1 | 1 |

*Fig. 9b*

| Layer | Wall Location | Correction Amount |
|---|---|---|
| 1 | 945 | +5 |
| 2 | 942 | +8 |
| 3 | 946 | +4 |
| 4 | 949 | +1 |

*Fig. 9c*

| Layer | Bin 148 | Bin 149 | Bin 150 | Bin 151 | Bin 152 | Bin 153 | Bin 154 | ... | Bin 948 | Bin 949 | Bin 950 | Bin 951 | Bin 992 | Bin 953 | Bin 954 | Bin 955 | Bin 956 | Bin 957 | Bin 958 | Bin 959 |
|---|---|---|---|---|---|---|---|---|---|---|---|---|---|---|---|---|---|---|---|---|
| 1 | 0 | 0 | 1 | 1 | 0 | 0 | 0 | ... | 0 | 0 | 1 | 1 | 1 | 1 | 1 | 1 | 1 | 1 | 1 | 1 |
| 2 | 0 | 0 | 1 | 1 | 0 | 0 | 0 | ... | 0 | 0 | 1 | 1 | 1 | 1 | 1 | 1 | 1 | 1 | 1 | 1 |
| 3 | 0 | 0 | 1 | 1 | 0 | 0 | 0 | ... | 0 | 0 | 1 | 1 | 1 | 1 | 1 | 1 | 1 | 1 | 1 | 1 |
| 4 | 0 | 0 | 1 | 1 | 0 | 0 | 0 | ... | 0 | 0 | 1 | 1 | 1 | 1 | 1 | 1 | 1 | 1 | 1 | 1 |

*Fig. 9d*

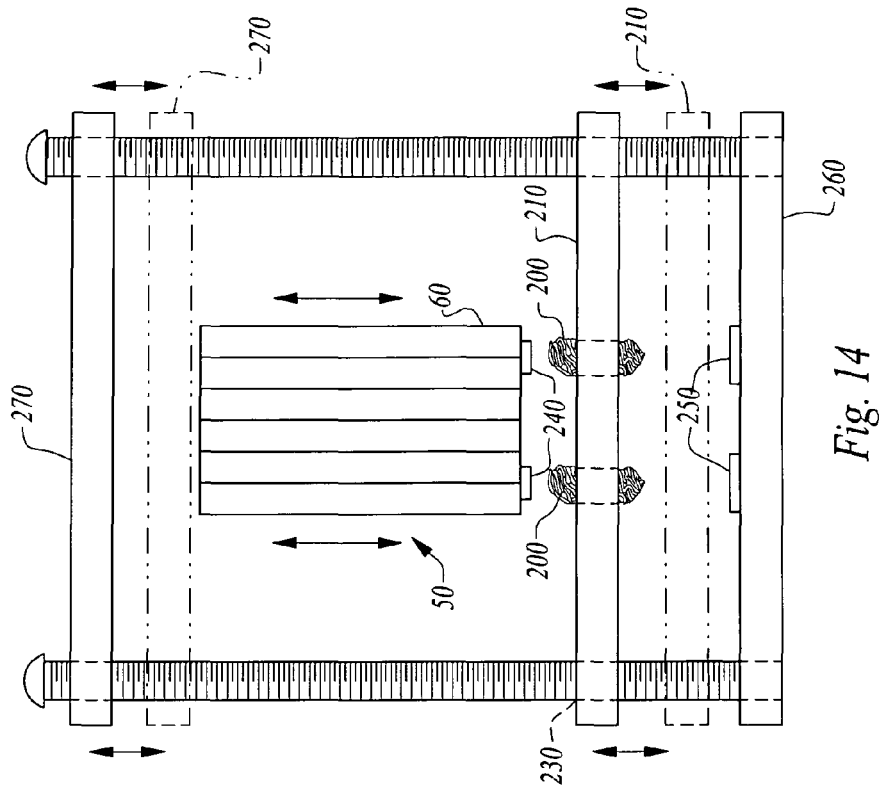
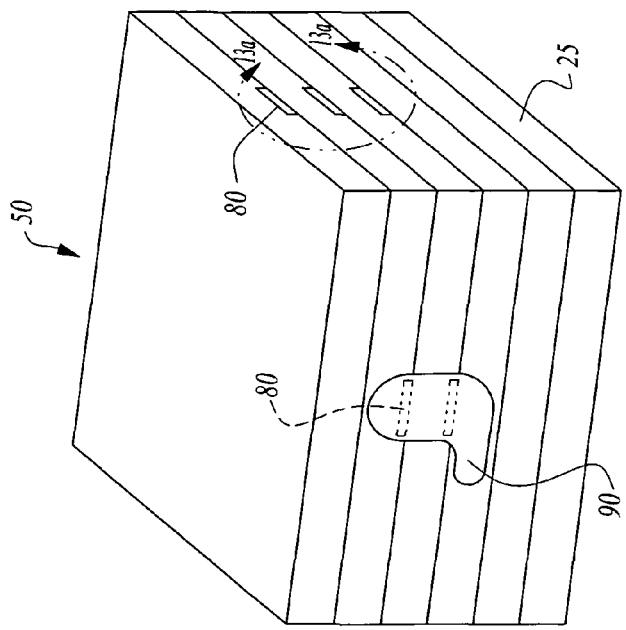
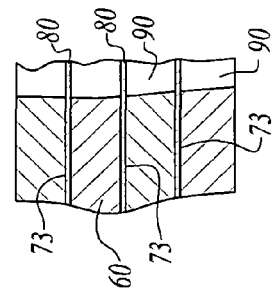

THREE-DIMENSIONAL LADAR MODULE WITH ALIGNMENT REFERENCE INSERT CIRCUITRY COMPRISING HIGH DENSITY INTERCONNECT STRUCTURE

CROSS REFERENCE TO RELATED APPLICATIONS

This application is a continuation-in-part of U.S. patent application Ser. No. 11/499,403, entitled "High Density Interconnect Assembly Comprising Stacked Electronic Module," filed Aug. 4, 2006, which claims priority to and the benefit of U.S. Provisional Patent Application No. 60/711,375, entitled "High Density Interconnect Scheme For Stacked Electronic Modules," filed Aug. 26, 2005, each of which is incorporated herein by reference.

This application is a continuation-in-part of U.S. patent application Ser. No. 11/706,724, entitled "Three Dimensional LADAR Module with Alignment Reference Circuitry," tiled Feb. 15, 2007 (now U.S. Pat. No. 7,436,494), which claims priority to and the benefit of U.S. Provisional Patent Application No. 60/785,135, filed Mar. 24, 2006, entitled, "Method for Image Jitter Reduction in a Multilayer LADAR Device," and is also a continuation-in-part of U.S. patent application Ser. No. 10/806,037, entitled "Three-Dimensional Imaging Processing Module Incorporating Stacked Layers Containing Microelectronic Circuits," filed Mar. 22, 2004 (now U.S. Pat. No. 7,180,579), which claims priority to and the benefit of U.S. Provisional Patent Application No. 60/462,677, entitled "High-Speed Transmitter and Receiver Incorporating Three-Dimensional Readout Electronic Module," filed Mar. 28, 2003, each of which is incorporated herein by reference.

STATEMENT REGARDING FEDERALLY SPONSORED RESEARCH AND DEVELOPMENT

This invention was made in part with U.S. Government support under Contract No. DAAD17-01-D-0006-0002, awarded by the Army Research Laboratory (ARL). The U.S. Government has certain rights in the invention.

BACKGROUND OF THE INVENTION

1. Field of the Invention

The instant invention relates generally to the field of LADAR (laser-radar) imaging technology. Specifically, the instant invention relates to a device which allows three-dimensional laser imaging of, for instance, partially obscured or camouflaged targets with very high range resolution and sensitivity and which includes a high density interconnect structure.

2. Description of the Related Art

In general, existing LADAR imaging systems include a laser source, appropriate optics in conjunction with a detector array, processing circuitry suitable for processing the detector array output into a usable form and post-processing circuitry and software capable of taking the processed detector array output and converting it into a usable format such as an image on an electronic display.

Current LADAR imaging methods typically comprise scanning a target with a series of laser pulses and detecting the reflected photons (also referred to as a laser echo) with a photon detector array such as a focal plane array. The time measured between the initiation of each laser pulse and the return of the corresponding laser echo reflected from the target to the photon detectors on the array is used to calculate target range and to define surface features on a three-dimensional object. Such imaging capability is valuable in situations where, for instance, a vehicle is camouflaged or obscured by foliage or in an urban environment when an imaging sensor can acquire only a limited or angular view of a target.

Because the time of flight of the returning laser echoes will vary based on the distance between the detector array plane and the individual surface features from which the echoes are received, a three-dimensional image of a target can be assembled based upon the relative echo delays calculated from the corresponding outputs of the individual detectors in the array.

As an example, a laser echo delay between two laser echoes (traveling at about the speed of light) of one nano-second ($10^{-9}$) suggests a target surface variation of about 15 centimeters. A similar laser echo delay of 500 picoseconds ($10^{-12}$) between two laser echoes translates into a target surface variation of about eight centimeters.

As is evident from these short time periods, very high detector signal processing and timing circuit speeds are desirable in order to resolve target surface feature variations at a centimeter-level depth resolution. Unfortunately, existing LADAR imaging systems lack the necessary circuit speed and capacity to achieve very high (i.e., centimeter) range resolution and sensitivity.

Alternative prior art imaging means include conventional passive visible sensors, such as CCD video sensors, which provide easily interpreted information to an observer. Nonetheless, these types of sensors are undesirable where accurate scene information in a complex video environment (i.e., camouflaged or partially obscured targets) is an important factor in the observer's decision-making.

Accordingly, a need exists for a LADAR imaging system that has the circuit speed and density required to achieve range resolution and sensitivity necessary to define small target surface variations based on picosecond time of flight differences in laser echoes.

The instant invention addresses the aforementioned problems in prior art devices by providing a reliable, high speed, high circuit density LADAR detector system and device capable of providing range resolution and sensitivity at a centimeter level.

BRIEF SUMMARY OF THE INVENTION

A first aspect of the present invention comprises a photon source, such as a laser, beam shaping optics, a two-dimensional photo-detector array comprised of multiple photo-detector pixels, an optical lens for collecting reflected photons (laser echo) upon the detector array, and a processing module comprised of stacked layers of readout electronics integrated circuit chips (ROIC), wherein each ROIC-containing layer has one or more channels, each channel comprising a digitizing and storage circuitry for processing the detector array output.

In a further aspect of the invention, external support circuitry is provided for the generating of a three-dimensional image on an electronic display from the output of the processing module.

In yet a further aspect of the invention, one or more alignment reference points are inserted at a predetermined point in the image capture cycle to allow the electronic alignment of selected sets of image data collected by the FIFO shift registers in the one or more channels of the one or more ROICs contained in the processing module. In this aspect of the invention, alignment reference point insertion and alignment circuitry is provided as means to minimize layer-to-layer or channel-to-channel "jitter" which may be present due to variances in layer operating or data capture start-up characteristics. Alternatively, the invention allows a user to selectively insert an alignment reference point in an individual channel.

The enhanced imaging capability provided by the claimed invention is achieved, in part, by the use of stacked layers containing the ROIC circuitry, which increases detector output processing circuit density while minimizing circuit lead length and associated electrical parasitics. The benefit of the use of stacked layers of ROIC circuitry is the ability to integrate a large (e.g., 128×128 or larger) detector array with associated dedicated detector readout circuitry (amplifier, threshold detector, sampling circuitry, analog to digital (ADC), digital to analog converters (DAC) and first in, first out, (FIFO) shift register "range" bins all within a very small module.

The resultant module permits the circuit speeds and densities required to resolve small, three-dimensional target features based on one or more laser echoes sensed by the detector pixels on the detector array while simultaneously providing dedicated processing channels for each detector on the detector array.

The multi-layer ROIC processing module is preferably comprised of a stack of layers containing thinned, integrated circuit chips, each layer including one or more receiver channels. Each channel comprises circuitry which detects the laser echo time from $T_0$ (the start of a laser pulse or a user-assigned $T_0$ point) to the time of laser echo return, based on the receipt of photons that are reflected from the imaged target surfaces.

The laser echo time of flight information is pre-processed and then converted to a digital bit or bits which are stored in a FIFO shift register comprising a set of "range bins" on the ROIC. A high bit in a range bin may, for instance, be designated as indicating the time of arrival of a laser echo, based on its position within the set of range bins.

The FIFO range bin data is preferably multiplexed out of the channels in the ROIC processing module to external post-processing circuitry which, in turn, aligns and interprets the data and converts it to a usable form, such as an electronic representation of 3-D point cloud for display as an electronic image on a screen.

In a preferred embodiment, a high density interconnect structure is provided comprised of a dielectric structure and one or more compressible conductors for the electrical connection of the module to external circuitry.

While the claimed apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

BRIEF DESCRIPTION OF THE DRAWINGS

FIG. 1 is a block diagram of the present invention.

FIG. 5 reflects a data set in a single FIFO shift register after the shift register is filled.

FIG. 7 reflects a data set showing reference line insertion data in a set of range bins in a FIFO shift register over multiple clock cycles.

FIGS. 9a, 9b, 9c and 9d show representative data sets in the FIFO of the invention in various states of data capture.

FIGS. 10a and 10b are exemplar output illustrations of pre-histogram processing and post-histogram processing of null image data in an eight layer module.

FIGS. 13 and 13a illustrate a representative electronic module of the invention and shows access leads accessible on a peripheral surface thereof and a cross-section thereof.

FIG. 14 shows an exploded view the electronic module of the invention for connection to an external circuit by means of an interposer assembly and compression frame.

Figure 2A:
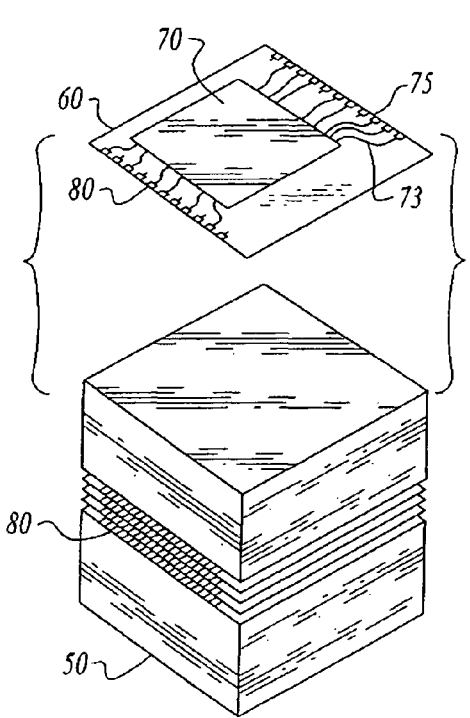
FIGS. 2a and 2b are perspective views of the individual ROIC layers and stacked configuration of the present invention

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Turning now to the figures wherein like numerals designate like elements among the several views, FIG. 1 shows a block diagram of a preferred embodiment of the present invention.

A photon source, such as a laser 1, generates a beam pulse 5, which is directed toward a scene or target 7, through suitable beam-shaping optics 10.

A 3-D LADAR imaging system incorporating stacked microelectronic layers is provided. A light source such as a laser is imaged upon a target through beam shaping optics. Photons reflected from the target are collected and imaged upon a detector array through collection optics. The detector array signals are fed into a multilayer processing module Wherein each layer includes detector signal processing circuitry. The detector array signals are amplified, compared to a user-defined threshold, digitized and fed into a high speed FIFO shift register range bin. Dependant on the value of the digit contained in the bins in the register, and the digit's bin location, the time of a photon reflection from a target surface can be determined. A $T_0$ trigger signal defines the reflection time represented at each bin location by resetting appropriate circuitry to begin processing.

A reference insert circuit inserts data into the FIFO registers at a preselected location to provide a reference point at which all FIFO shift register data may be aligned to accommodate for timing differences between layers and channels. The bin data representing the photon reflections from the various target surfaces are read out of the FIFO and processed using appropriate circuitry such as a field programmable gate array to create a synchronized 3-D point cloud for creating a 3-D target image.

An embodiment comprises the use of compressible conductors such as Fuzz Buttons to interconnect one or more of the layers to an external circuit.

In a preferred embodiment, laser 1 is a 1064 nm, mechanically aligned, 300 micro-Joule, seed YAG laser capable of producing a pulse width of 500 picoseconds. In the preferred embodiment, a beam amplifier is provided (not shown), such as a master oscillator power amplifier, wherein a seed beam is fed into the amplifier. In this preferred embodiment, the seed beam passes through a Faraday rotator and enters a four-pass, thermally-controlled amplifier which includes two pumped YAG diodes.

In the preferred embodiment, beam-shaping optics 10 is a beam-shaping holographic lens suitable for projecting a rectangular beam area on a target. It has been determined that a rectangular beam area optimizes the ability of a detector array to receive and process reflected photons in its field of view.

Beam 5 is preferably amplified to generate a detectable photon reflection off of a target having 10% reflectivity at 100 meters.

Suitable collection optics 20 are provided, preferably a 75-mm, F1.4 lens with an appropriate spectral filter for optimization of the selected laser pulse wavelength. Beam collection optics 20 are oriented so as to receive photons that are reflected from the imaged target 7, (i.e., the collective obscuration, subject and ground) and focus them upon the detector array as is discussed below.

After beam amplification, beam 5 may optionally be pre-aligned with the detector array by passing beam 5 through Risley prisms (not shown) to steer and rotate beam 5 for "bore sighting" to the detector array. It has been determined that placing beam-shaping optics 10 in close proximity to and aligned with collection optics 20 minimizes parallax error with respect to the two optical subassemblies.

Further included is sensor means such as a detector assembly 30 comprising an electronic sensor, such as a detector array 40 having a detector output signal and a multilayer readout electronics processing module 50 comprising one or more integrated circuit layers.

Detector array 40 is preferably a focal plane array comprising individual photo-detector pixels suitable for detecting reflected photons from a target and generating an output signal in response thereto. In the preferred embodiment, an InGaAs detector array is used. Irvine Sensors Corp., the assignee herein, has demonstrated a 128×128 InGaAs detector array with 40-micron active detectors on 50-micron centers in the disclosed invention, wherein a 128×8 set of detectors on the array were accessed.

Figure 2B:
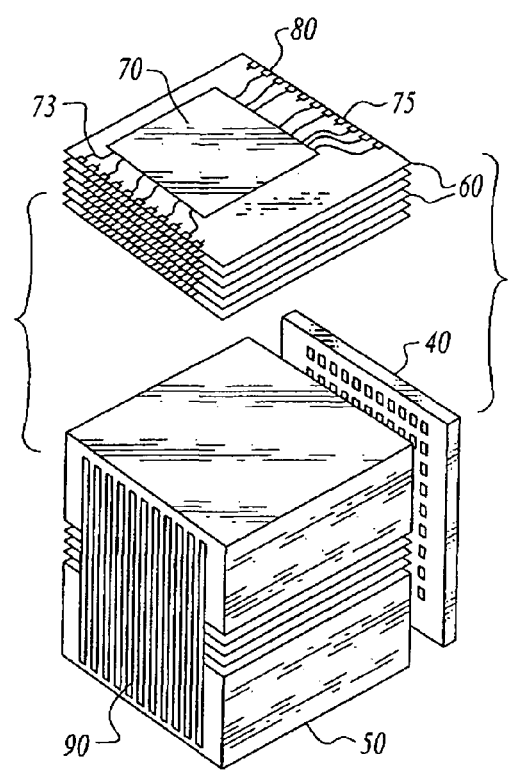
Figure 3:
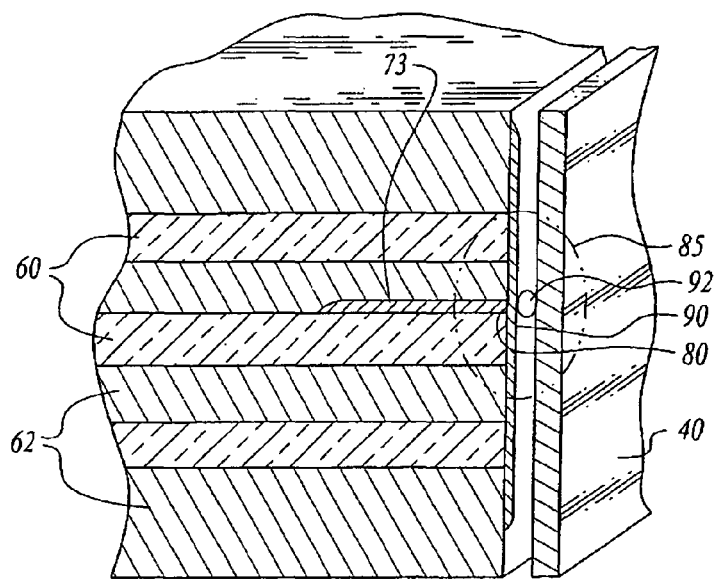
FIG. 3 is a cross-section the processing module of the present invention showing an exemplar T-connect and bump bond.

Turning now to FIGS. 2*a*, 2*b* and 3, processing module 50 includes a bonded stack of two or more microelectronic layers 60, each layer comprising one or more readout electronic integrated circuits or ROICs 70, preferably in the form of integrated circuit chips, for the processing of signals received from detector array 40. Each readout electronic circuit 70 comprises one or more channels 75 comprised of sensor-converting electronic circuitry for the converting of the electronic output of detector array 40 to a digitized data value comprised of one or more digital bits, a plurality of which comprise an image data set.

Individual IC layers 60 are fabricated so that appropriate input, output, power and ground paths of read-out electronic integrated circuits 70 are rerouted using metalized traces 73 to one or more edges of each layer 60 to define one or more access leads 80 proximal the lateral surface of layer 60.

Layers 60 are bonded together using an appropriate adhesive 62 such as an epoxy to form a three-dimensional module 50. The lateral surfaces of the module are processed (e.g., ground or lapped) so as to expose conductive access leads 80 on the lateral surface of module 50. Layers 60 may optionally be thinned prior to bonding using techniques that are known in the field of semiconductor processing and packaging. Thinned active layers may also be embedded silicon cap chips for ease of processing and handling.

Suitable interconnect structures 90 are formed on one or more lateral surfaces of processing module 50 to form one or more "T-connects" 85 to allow the electrical connection of access leads 80 directly to the outputs of detector array 40 and to the image processing electronics in the stack such as by the use of conductive bumps 92.

FIG. 3 illustrates a cross-section of an exemplar T-connect 85 between a bump bond on a detector array 40 and a metalized access lead 80. The T-connect structures conveniently allow the interconnection of the high-density stack of layers to detector array 40 and external circuitry contained external of the processing module.

A preferred embodiment provides interconnect structures 90 formed on one or more processor module lateral surfaces so as to allow the electrical connection, such as by bump bonding, of detector array 40. Indium bump bonding is a preferred method of bump bonding in the disclosed invention.

After electrical connection of detector array 40, the volume occupied by perpendicularly disposed detector array 40 and processor module 50 is minimized yet the detector-to-readout circuitry lead length is optimized to increase speed while reducing parasitic capacitance. Such an interconnection orientation takes full advantage of the high circuit density of the processing module while providing very short circuit paths necessary for high-speed laser range resolution.

External post-processing electronic circuitry 100 for receiving and post-processing the output of processor module 50 may be connected to interconnect pads 90 through the use of compressible conductors such as "Fuzz Buttons", as is further discussed below.

Alternative means for connection of external electronic circuitry 100 to interconnect structures 90 of FIG. 2*b* include solder, conductive epoxies, wire bonding or other suitable means formed on the accessible conductive surfaces of processing module 50.

In system operation, beam 5 expands outward from beam-shaping optics 10 and is imaged upon the desired target. Photons from the pulsed beam 5 which are not absorbed or scattered by the target, are reflected and returned to collection optics 20 from the target surface. Because the distance between the differing target surfaces and collection optics varies, so will the time that the reflected photons are received by the detector assembly. Note that each individual detector in the detector array may receive multiple signal returns from photon reflections off of scene surfaces at different distances from the detector array.

Beam 5 is swept across the target area in a scan to attain, by way of example, 256 vertical samples. In this example, the laser is pulsed at 94 Hz to attain 256 horizontal samples while the channel data records any received laser echo in suitable storage circuit means such as a FIFO shift register for the storing of a digitized data value. In a preferred embodiment, storage circuit means comprises 1024 FIFO shift register range bin circuits. Each range bin circuit has a variable logic state and a unique position in the storage circuit.

Figure 4:
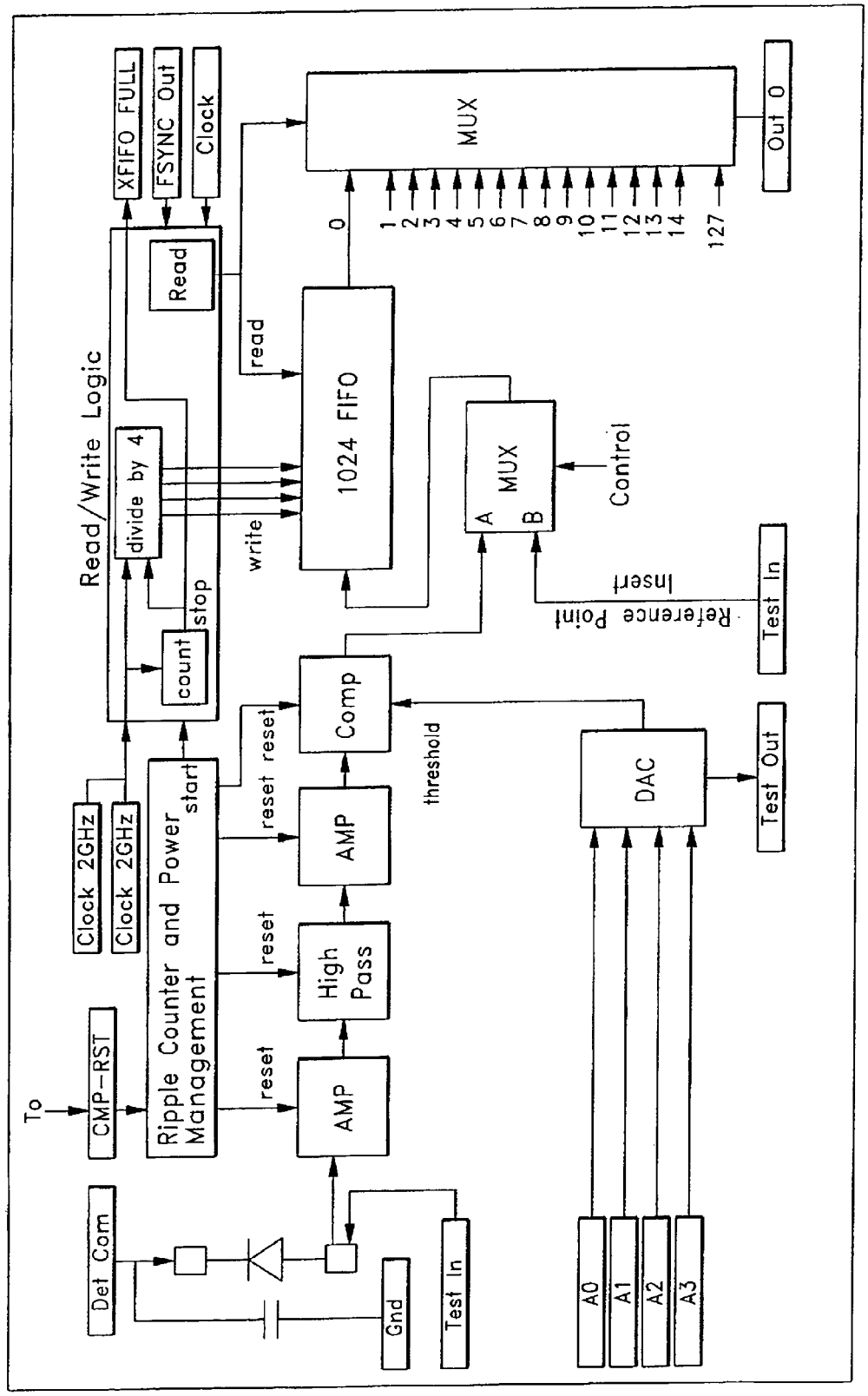
FIG. 4 is a circuit block diagram of the integrated circuit of a preferred embodiment of the present invention.

An exemplar block diagram of a preferred embodiment of a channel on the ROIC chip is shown in FIG. 4. As indicated above, each ROIC chip is preferably comprised of multiple channels. As illustrated in FIGS. 1 and 4, each channel 75 provides a dedicated detector signal input circuit and includes circuitry that receives a $T_0$ trigger signal (initial laser pulse trigger) to provide the FIFO shift register with a reference for the time of the laser echo's arrival at detector array 40. The preferred laser pulse is short relative to the capture interval (e.g.—500 picoseconds vs. 500 nanoseconds) and multiple returns can be detected by a single detector pixel.

Each channel 75 is preferably comprised of an analog section that operates with a relatively high bandwidth. Each channel further comprises a digital section operating at, in a preferred embodiment, up to 2 GHz during the time the FIFO shift register is filling with data. A digital to analog converter is included in channel 75 as well as circuitry to allow a user to adjust an included comparator's threshold. Each ROIC is preferably provided with multiple channels (e.g., 128 channels).

Received laser echoes are integrated and filtered by the channel during an image capture interval. The integrated signals are then amplified and differentiated using suitable electronic circuitry for converting received echoes into electronic pulses with an amplified signal strength sufficient to allow detection by the comparator circuitry. The comparator circuitry detects whether the pulses are above or below a programmable predetermined threshold. In the preferred embodiment, the comparator's output is sampled at a 2 GHz rate, resulting in a one bit, analog to digital converted signal.

In the preferred embodiment, each channel 75 includes a 1024 deep, FIFO shift register (i.e., a 1024 bin shift register) which receives and stores the comparator's output from $T_0$ to $T_0$ plus approximately 500 nanoseconds. In a FIFO shift register bin set of 1024, this results in each bin representing a period of about 500 picoseconds, (i.e., 500 ns/1024 bins). Each bin in the FIFO has a position in the shift register and is capable of having a variable logic state (e.g., 0V=logical "0", +1.8V=logical "1"). A "1" or high bit in a FIFO register may be regarded as marker representing the arrival time of a laser echo with respect to the $T_0$ signal, as determined by the bit's location in the register. With the FIFO clocking at an exemplar 2 GHz rate, each bin of the shift register represents about 500 picoseconds of time history, which in turn, equates to about 7.5 cm of range history based on the laser echo traveling at about the speed of light.

The initiation point of the $T_0$ trigger signal is preferably variable by a user to allow system adjustment to accommodate for longer return times for laser echoes returning from more distant targets.

After the 1024 bins of the FIFO shift registers in the channels in the preferred embodiment are filled, the captured FIFO contents are read out to external processing circuitry 100. A preferred method of reading out the FIFO register data is by multiplexing the digitized FIFO data out to external processing circuitry 100 using conventional frame and line signals at a 20 MHz rate. The multiplexed data may be processed at this point using appropriate external circuitry to create a 3-D point cloud defined by the target and further processed to create a 3-D electronic image or may be further processed to minimize jitter as discussed below.

The 256×256×1024 data is recorded as a frame. Multiple frames of FIFO image data are electronically registered and coalesced into a 3-D point cloud in suitable external electronic circuitry for display as a 3-D image for classification of target objects.

FIG. 5 illustrates an exemplar set of image data that have been captured on a channel in a set of 0-n FIFO register bins on an ROIC layer X from a returning laser echo. It can be seen that during the capture cycle in which the bins in layer X were filling, a laser echo was received in bin 5 as a logical 1. The logical 1 at bin 5 can be used to calculate the time of flight of the initial laser pulse and its return, which in turn is used to calculate the distance of the surface from which the laser was reflected.

Because multiple ROIC layers in a high-speed LADAR system (e.g., GHz clock speeds) do not necessarily begin acquiring data at precisely the same instant, the individual layers may capture data asynchronously with respect to the other layers in the stack. In an alternative preferred embodiment, layer-to-layer asynchronous data capture or jitter resulting from variances in layer-to-layer operation is minimized by inserting a digital alignment reference point or "brick wall" at about the end of each image data capture cycle at the same point in time in each selected channel during range bin filling. A reference insert circuit means is provided for inserting one or more user-defined reference points at one or more predetermined positions in the image data set.

Layer-to-layer jitter can then be minimized by realigning the inserted alignment reference points on each layer to each of the other layers, thus shifting the images of the layers (i.e., image data sets) into alignment.

When a 3D image is being captured, a solid electronic "wall" of logical "1"s is asserted on the reference point insert line which is common to all FIFO inputs in each of the layers, and is seen in the set of selected bins as an electronic alignment point. This method and device rely on the fact that when the bulk of the data have been sampled, the alignment reference point insert line is activated and, from that data capture point forward, all inputs into the FIFO shift registers are registered as logical "1"s.

The alignment reference points are inserted using appropriate reference insert circuit means in electrical connection with at least one preselected bin circuit (e.g. a data input port or TESTIN herein) in the FIFO shift registers for selectively asserting a user-defined predetermined bin logic state in at least one preselected bin circuit in the FIFO shift register in one or more ROIC channels. Using a common input into the FIFO in each layer in the stack allows the insertion of the alignment reference point into the incoming image data at a user defined point in time. Upon readout of the image data from the FIFO in which the alignment reference point has been inserted, a histogram on each of the layers' data is performed to determine the alignment reference point position of each layer to define the realignment point for all data sets.

Figure 6:
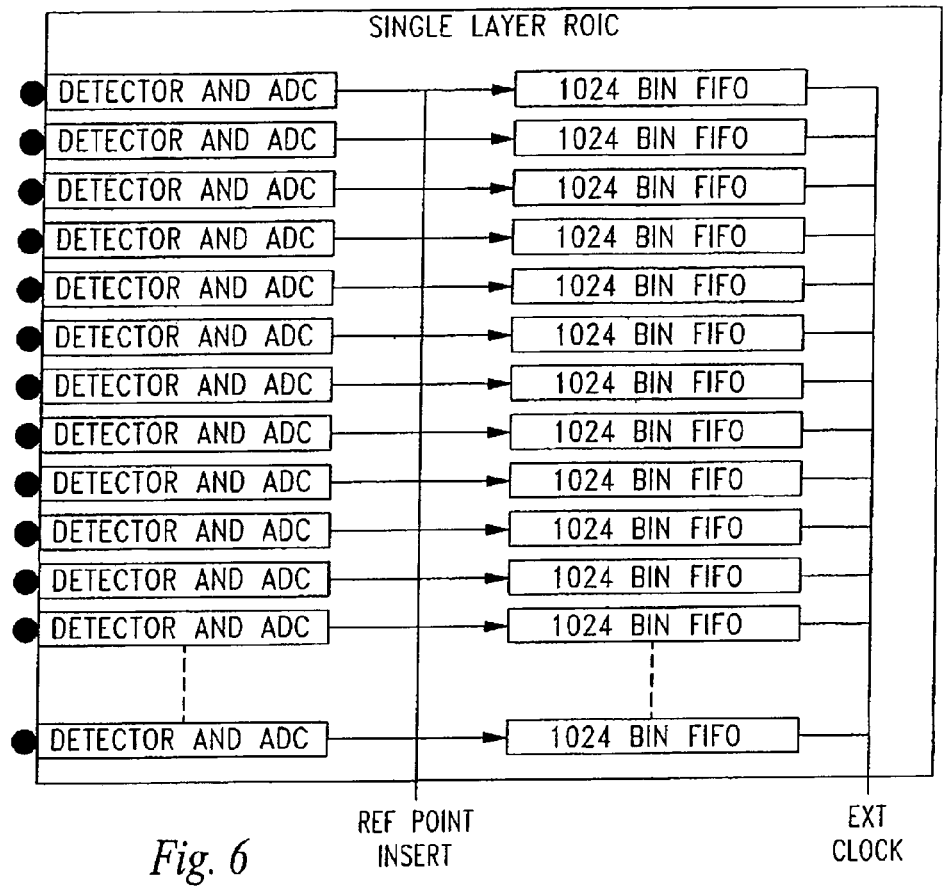
FIG. 6 illustrates selected circuit elements in a single layer ROIC.

Turning now to FIG. 6, a block diagram is shown reflecting an exemplar single layer of the ROIC inside a 3D laser imaging system. Each detector is in electrical connection with an amplifier, which detector output undergoes an analog to digital conversion.

The digitized output is received by the FIFO at the data input port of the shift register, which, in this example, can store 1024 consecutive samples of data. In the illustrated embodiment, the resulting image size is (number of pixels) (1)(1024). Multiple layers are stacked to form a three-dimensional image, i.e., eight layers of an ROIC would provide an image of 68×8×1024 pixels.

FIG. 7 shows a basic illustration of the operation of the reference insert line in a FIFO shift register having 0-n bins in LADAR system in an exemplar 13 clock cycles.

In FIG. 7, the Xs represent "don't care" states that are unfilled bins in a FIFO shift register during an image capture cycle.

At clock cycle 0, the digitized output of a detector is received by the input bin in the FIFO shift register. In this instance, the input is a logical 0. In this embodiment, the logical 0 represents no laser echo captured by the detector in clock cycle 0.

At clock cycle 1, a digitized laser echo is received, resulting in a logical 1 being received into the FIFO bin set.

At clock cycles 2-8, the FIFO shift register bins continue to fill with and shift data from the output of the detector in the system.

Turning to clock cycle 9, a predetermined insert time has been selected, in this instance, at about bin 3, wherein at the point in time where detector data (either 0 or 1) has been received by bin 3, the reference insert line is activated such that alignment reference points are fed into and received by the FIFO shift register bins in each of the layers. Logical "1"s from the reference insert line will continue to be received by the bins in the shift register until the entire set of bins is full (e.g., clock cycle 12 in this example) at which time, the entire data set from the channel is read out for further data aligning and processing as discussed further below.

Because the data sets that are read out contain reference points for use in aligning other data sets therewith, it is possible to remove jitter associated with the asynchronous operation of each layer by performing a histogram calculation such as a simple cumulative histogram. Reference point synchronization circuit means is provided for performing such histogram calculations which means can desirably be implemented in a field programmable gate array.

Figure 8:
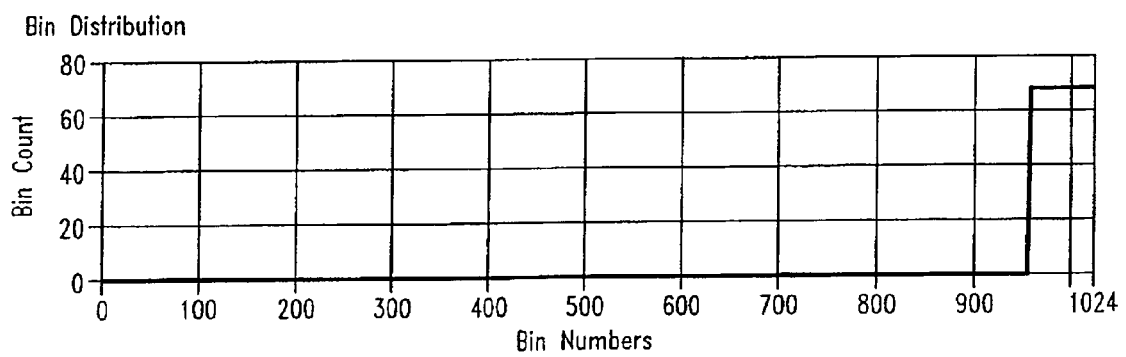
FIG. 8 is a histogram for a null image where no data are captured from the detector output.

With respect to FIG. 8, a histogram for a null image is shown, where no data are captured from the detector output. In FIG. 8, 950 FIFO bins of valid data have been captured, the reference point insert activated and the remaining bins 951 to 1023 now contain a "brick wall" of logical "1"s. As is reflected, the bin count ramps up to the maximum at the alignment reference point insertion, i.e., 950.

Turning to FIGS. 9a-9d, FIG. 9a shows an exemplar data set prior to reference point correction where the laser echo return indicated by a "1" physically occurs at bin 150 but due to layer jitter, the individual layers acquire the echoes as offset in varying amounts with respect to each other.

The corresponding alignment reference point data would then appear as that illustrated in FIG. 9b where the predetermined reference insert time is designated as occurring at about the time bin 950 receives digitized detector data. In other words, the user selectively defines a time period or number of clock cycles at which point the reference line is asserted so as to insert the brick wall into the bins in each of the layers or channels. For example, where each bin represents about 500 picoseconds in a 2 GHz clock system, a user can define the reference insert line to assert at, for instance, 475 nanoseconds, which translates to a brick wall insert at about bin number 950.

The correction offset table is shown in FIG. 9c, showing the number of bins a layer's data must be moved to align the data set to the other layers' data sets.

FIG. 9d illustrates how the jitter correction operates where the acquired image data is located around bin 150 once the images in each layer have been moved by the number of bins calculated as a correction amount. The brick wall is shown from bin 950 to the remaining number of bins in the register.

Exemplar outputs of pre-histogram processing and post-histogram processing of null image data in an eight layer module are shown in FIGS. 10a and 10b respectively. As is seen, the bin count increase at the alignment reference point of bin 950 is much steeper in the corrected Figure indicating the data alignment shift.

Appropriate reference point synchronization circuit means, such as an FPGA is incorporated with output circuit means, such as multiplexing circuitry for the receiving of and synchronizing of the outputted digitized data values of the FIFO shift registers on one or more of said layers using the inserted reference points for generating a plurality of synchronized digitized data values.

The digitized and aligned data values are further processed by suitable post-processing circuitry 100 to create a 3D point cloud for producing an image.

Figure 11:
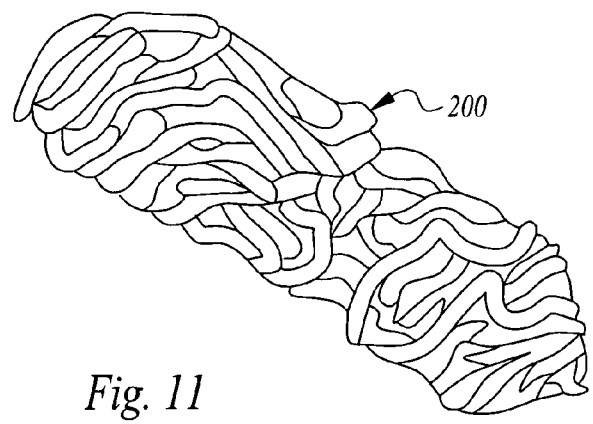
FIG. 11 is a compressible conductor of the invention comprising one or more strands of wire in a generally elongate, cylindrical form.

Turning now to the FIG. 11, a compressible conductor 200, such as the above referenced "Fuzz Button" is illustrated for a preferred embodiment interconnection of the module 50 to an external circuit.

Compressible conductor 200 is preferably manufactured from a single strand of 0.002" gold plated beryllium copper wire compressed into a cylindrical shape as are available from Custom Interconnects, Inc.

Compressible conductor 200 is not limited to a single strand construction and may be desirably fabricated from a plurality of wire strands or other electrically conductive materials with suitable mechanical and electrical properties for the end application of the conductor as is well-known in the materials arts.

A preferred embodiment of compressible conductor 200, as illustrated, is a 0.020" diameter cylindrical element. The single wire strand construction has the desirable attributes of relatively high temperature operation, reduced signal path and associated lower inductance and distortion. A random wire orientation in the structure of compressible conductor 200 assists in the cancellation of electronic fields created by electrical conduction and has the further desirable attribute of compressibility of between 15% to 30% of its nominal original height.

This form of conductor can be repeatedly (i.e., twenty or more times) compressed and decompressed while still retaining its nominal original height. Compressible conductor 200 may selectively be used with or without solid contact pins on the terminal ends thereof.

Figure 12:
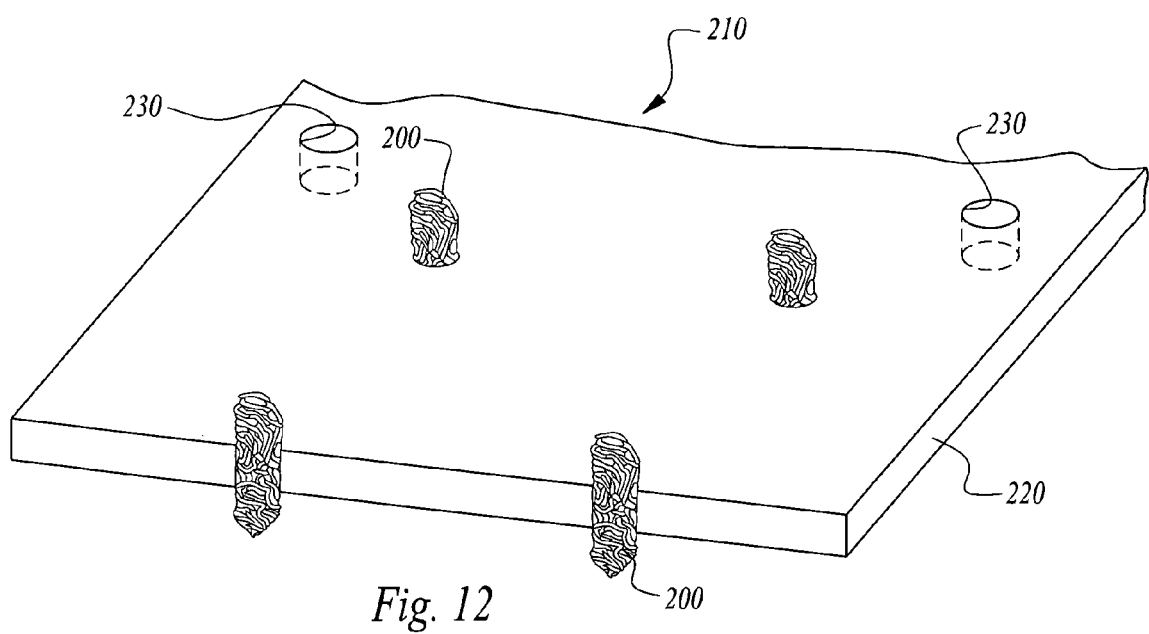
FIG. 12 is a cross-section of a perspective view of the high-density interposer assembly of the invention.

As illustrated in FIG. 12, in a preferred embodiment of the invention, an interposer assembly 210 is provided comprising a dielectric layer 220 and one or more compressible conductors 200. Dielectric layer 220 is preferably formed from a non-conductive plastic material such as ULTEM 1000 as is available from Gehr Plastics, Inc.

One or more compressible conductors 200 are disposed within and through the thickness of a dielectric layer 220 wherein the terminal ends of compressible conductor 200 outwardly depend from the opposing first and second major planar surfaces of dielectric layer 220.

A preferred method of fabricating interposer assembly 220 is to drill through-holes in the requisite pattern through dielectric layer 220 for the retention of the body of compressible conductor 200. In this manner, the respective terminal ends of compressible conductor 200 are accessible from the respective sides of dielectric layer 220 and provide an electrically conductive path through the thickness thereof. One or more registration holes 230 are preferably provided through dielectric layer 220 for the subsequent registration of interposer assembly 210 with the conductive pads between which it will be disposed. Registration holes 230 are used to maintain alignment of conductors 200 with the respective conductive pads upon which they will be disposed by using a registration pin mount when interposer assembly 210 is mounted in the invention as is more fully discussed below.

Turning to FIG. 13a, a magnified cross-section of a portion of a preferred embodiment of a three-dimensional microelectronic module 50 is shown wherein one or more layers 60 containing bare die integrated circuit chips are stacked and bonded together. The individual layers comprise metalized traces 73 and passivation layer (not shown) for the rerouting of electronic signals from the integrated circuit chips in the layers to the edges of the layers to form access leads 80 terminating at the periphery of module 50.

By way of example and not by limitation, module 50 may comprise layers of bare integrated circuit die (i.e., ASICs), commercial off the shelf (COTS) packaged parts, modified prepackaged parts or neo-layers.

Module 50 is comprised of individual layers 60 that are bonded together with a suitable adhesive to form an integral assembly. One or more of layers 60 comprise integrated circuitry but may further comprise discrete embedded components such as resistors, inductors, capacitors and the like.

User-defined metalized conductive traces 73 are formed upon a planar surface of each layer 60 as needed so as to reroute electronic signals, such as clock, enable, data, power, ground, etc. to the edge of the layer to form access lead 80. Access leads 80 are selectively provided on one or a plurality of module peripheral surfaces.

As seen in FIGS. 13 and 14, metalized traces 73 may be used to interconnect access leads 80 between the layers in the module as well as rerouted to create one or more first contacts 240 to electrically connect the module to one or more second contacts 250 on an external surface such as an external printed circuit board 260.

FIG. 14 shows a preferred configuration of the module and assembly of the invention. Complementary first and second contacts 240 and 250 are fabricated on a surface of module 50 and printed circuit board 260 respectively and are in substantial registration with each other. Interposer assembly 210 is fabricated whereby the requisite compressible conductors 200 are registered and oriented to be in mechanical contact with the respective first and second conductive pads when interposer assembly 210 is disposed and aligned between module 50 and printed circuit board 260.

In a preferred embodiment of the invention, compression frame 270 is provided for the urging of module 50 approximately normal to printed circuit board 260 to control compression and to retain the module on the printed circuit board using, for instance, threaded means, such as screws, nut and bolt and the like.

As can be readily seen, when module 50 is compressed upon printed circuit board 260, such as by means of compression frame 270, and when compressible conductors 200 and first and second contacts 240 and 250 are in proper registration, compressible conductors 200 are put in mechanical connection with first and second contacts 240 and 250, creating an electrical connection between them.

Alternately, when the compression source is removed, module 50 may be mechanically separated from interposer assembly 210, providing the benefit of the selective insertion or removal a module from an external circuit without the need for reflowing solder ball connections, breaking wire bonds or conductive epoxy connections. Such a configuration is ideal for testing module performance and functionality in an external circuit without creating permanent metallurgical or adhesive circuit connections.

In an alternative preferred embodiment, not shown, module 50 may be fixedly disposed within a cavity or housing and the interposer assembly and printed circuit board compressed upon the module.

It is noted that any suitable mechanical means may be used to fixedly retain the module, interposer assembly and external circuitry or to apply the appropriate compressive force between first and second conductive pads to create a mechanical and electrical connection between the respective pads.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

What is claimed:

1. An electronic circuit comprising:
a sensor configured to convert photons into an output signal; and
a processing module including at least two layers, wherein each of the at least, two layers comprises a channel that is configured to convert the output signal into an image data set including at least one digital bit;
wherein each channel includes:
a reference insert circuit configured to insert a user-defined reference point at a position in the image data set; and
a reference point synchronization circuit configured to synchronize the user-defined reference point with another user-defined reference point from another layer.

2. The electronic circuit of claim 1, further comprising a compressible conductor configured to electrically connect the electronic circuit to an external circuit.

3. The electronic circuit of claim 2, further comprising an interposer layer including a dielectric layer, wherein the compressible conductor extends through the dielectric layer.

4. The electronic circuit of claim 1, further comprising a first-in, first-out (FIFO) shift register configured to store the image data set.

5. The electronic circuit of claim 1, wherein each of the at least two layers comprises a readout electronic integrated circuit (ROIC).

6. The electronic circuit of claim 5, further comprising a conductive trace configured to route an electrical signal from the ROIC to an access lead disposed at an edge of one of the at least two layers.

7. The electronic circuit of claim 6, further comprising a T-connect structure configured to electrically connect the access lead to an output of the sensor.

8. The electronic circuit of claim 1, wherein the reference point synchronization circuit comprises a field-programmable gate array (FPGA).

9. The electronic circuit of claim 1, wherein all the channels of the at least two layers are defined upon a single integrated circuit chip.

10. The electronic circuit of claim 1, wherein each channel of the at least two layers is defined upon a separate integrated circuit chip.

11. The electronic circuit of claim 1, wherein the sensor comprises a focal plane array having a plurality of photodetector pixels configured to detect reflected photons.

12. The electronic circuit of claim 1, further comprising comparator circuitry configured to determine if a pulse of the output signal exceeds a predetermined threshold.

13. The electronic circuit of claim 12, wherein the predetermined threshold is programmable.

14. The electronic circuit of claim 1, wherein the user-defined reference point comprises a user-defined bin logic state, and wherein the reference insert circuit is further configured to insert the user-defined bin logic state in a preselected bin circuit of a FIFO shift register.

15. The electronic circuit of claim 1, wherein the reference point synchronization circuit is configured to accommodate for timing differences between its respective layer and the other layer by synchronizing the user-defined reference point with the other user-defined reference point from the other layer.

16. An electronic circuit comprising:
a sensor configured to convert photons into an output signal; and
a processing module including a stack of integrated circuit layers, wherein a first layer from the stack of integrated circuit layers comprises:
a channel configured to convert the output signal into an image data set including at least one digital bit;
a storage circuit configured to store the image data set;
a reference insert circuit configured to selectively insert a user-defined reference point at a pre-determined position in the image data set; and
a reference point synchronization circuit configured to synchronize the image data set with another image data set from another layer of the stack of integrated circuit layers using the user-defined reference point.

17. The electronic circuit of claim 16, further comprising an interposer layer including a dielectric layer and a compressible conductor, wherein the compressible conductor extends through the dielectric layer and is configured to electrically connect the electronic circuit to an external circuit.

18. The electronic circuit of claim 16, wherein the storage circuit comprises a first-in, first-out (FIFO) shift register.

19. The electronic circuit of claim 16, wherein the first layer further comprises a readout electronic integrated circuit (ROIC).

20. The electronic circuit of claim 19, further comprising a conductive trace configured to route an electrical signal from the ROIC to an access lead disposed at an edge of the first layer.

21. The electronic circuit of claim 20, further comprising a T-connect structure configured to electrically connect the access lead to an output of the sensor.

22. The electronic circuit of claim 16, wherein the reference point synchronization circuit comprises a field-programmable gate array (FPGA).

23. The electronic circuit of claim 16, wherein the sensor comprises a focal plane array having a plurality of photodetector pixels configured to detect reflected photons.

24. The electronic circuit of claim 16, further comprising comparator circuitry configured to determine if a pulse of the output signal exceeds a programmable predetermined threshold.

25. A method comprising:
converting detected photons into an output signal;
converting the output signal into an image data set at a first integrated circuit layer of a processing module, wherein the image data set includes at least one digital bit;
inserting a first user-defined reference point at a position in the image data set; and
synchronizing the first user-defined reference point with a second user-defined reference point associated with a second integrated circuit layer of the processing module.

26. The method of claim 25, further comprising detecting photons reflected from a target.

27. The method of claim 25, further comprising performing a histogram calculation at a field-programmable gate array (FPGA) to remove jitter associated with operation of the first integrated circuit layer or the second integrated circuit layer.

28. The method of claim 25, further comprising storing the image data set in a first-in, first-out (FIFO) shift register.

29. The method of claim 28, further comprising multiplexing the stored image data set to external processing circuitry.

30. The method of claim 29, wherein the external processing circuitry is electrically connected to the processing module via a compressible conductor disposed in an interposer layer.

31. The method of claim 25, further comprising determining via comparator circuitry if a pulse of the output signal exceeds a predetermined threshold.

32. The method of claim 31, further comprising storing an output of the comparator circuitry in a FIFO shift register.

33. The method of claim 25, wherein said synchronizing the first user-defined reference point comprises realigning the inserted first user-defined reference point with the second user-defined reference point to shift the image data set corresponding to the first integrated circuit layer into alignment with another image data set corresponding to the second integrated circuit layer.

* * * * *

UNITED STATES PATENT AND TRADEMARK OFFICE
CERTIFICATE OF CORRECTION

PATENT NO.         : 8,198,576 B2                                    Page 1 of 1
APPLICATION NO.    : 12/287691
DATED              : June 12, 2012
INVENTOR(S)        : Kennedy et al.

It is certified that error appears in the above-identified patent and that said Letters Patent is hereby corrected as shown below:

IN THE DRAWINGS:
In Fig. 9b, Sheet 6 of 8, delete "Bin 992" and insert -- Bin 952 --, therefor.

In Fig. 9d, Sheet 6 of 8, delete "Bin 992" and insert -- Bin 952 --, therefor.

IN THE SPECIFICATIONS:
In Column 1, Line 20, delete "tiled" and insert -- filed --, therefor.

In Column 3, Lines 63-64, delete "invention" and insert -- invention. --, therefor.

In Column 4, Line 53, delete "Wherein" and insert -- wherein --, therefor.

IN THE CLAIMS:
In Column 12, Line 57, in Claim 1, delete "least, two" and insert -- least two --, therefor.

Signed and Sealed this
Sixteenth Day of October, 2012

David J. Kappos
*Director of the United States Patent and Trademark Office*